(12) United States Patent
Hamzaoglu et al.

(10) Patent No.: US 6,519,176 B1
(45) Date of Patent: Feb. 11, 2003

(54) DUAL THRESHOLD SRAM CELL FOR SINGLE-ENDED SENSING

(75) Inventors: Fatih Hamzaoglu, Beaverton, OR (US); Ali Keshavarzi, Portland, OR (US); Yibin Ye, Hillsboro, OR (US); Siva G. Narendra, Beaverton, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 200 days.

(21) Appl. No.: 09/675,579

(22) Filed: Sep. 29, 2000

(51) Int. Cl.[7] ............................................. G11C 11/00
(52) U.S. Cl. ..................... 365/154; 365/156; 365/203
(58) Field of Search ................................ 365/154, 156, 365/203

(56) References Cited

U.S. PATENT DOCUMENTS 5,034,923 A * 7/1991 Kuo et al. .................. 365/154
5,134,581 A * 7/1992 Ishibashi et al. ............ 365/154
6,061,267 A * 5/2000 Houston ..................... 365/154
6,137,319 A * 10/2000 Krishnamurthy et al. ..... 327/51
6,181,608 B1 * 1/2001 Keshavarzi et al. ........ 365/154

* cited by examiner

Primary Examiner—Trong Phan
(74) Attorney, Agent, or Firm—Blakely, Sokoloff, Taylor & Zafman LLP

(57) ABSTRACT

A six transistor SRAM cell for single-ended sensing is described along with related memory architecture. The cell comprises a bistable circuit connected to complementary bit lines through a pair of passgate transistors. One of the passgate transistors has a lower threshold voltage than the other transistor. The lower threshold voltage is used to couple the cell to a single-ended sense amplifier through one of the bit lines. In one embodiment fewer than all the bit lines in an array are precharged in order to reduce power consumption in the array.

21 Claims, 2 Drawing Sheets

DUAL THRESHOLD SRAM CELL FOR SINGLE-ENDED SENSING

BACKGROUND OF THE INVENTION

1. Field of the Invention.

The invention relates to the field of static random-access memory (SRAM) cells and memory arrays.

2. Prior Art and Related Art

As semiconductor processes scale and improve, permitting smaller critical dimensions and lower supply voltages, logic circuit delays decrease in the order of 30% in each generation of new technology. Unfortunately, the delay in bit lines and sense amplifiers in high performance on-chip caches using differential low-swing sensing does not improve at the same rate. This is because the offset sensing voltage in the sense amplifier does not proportionately change with each generation and the bit line leakage limits the threshold voltage scaling. The resultant divergence between logic circuit delay and bit line delay has lead to the use of single-ended full-swing sensing which does scale with each new technology generation instead of the more traditional differential sensing.

With differential sensing, typically 100 mV difference between the complementary bit lines is sufficient for sensing. This relatively low swing provides fast sensing. However, as the passgate transistors which couple the bistable circuit to the complementary bit lines scale, leakage increases. This increase in leakage through the unselected cells makes sensing more difficult. One solution to this problem is to decrease the number of cells connected to each pair of bit lines and thereby impacting the number of rows in the cache and its architecture. For instance, reducing the number of cells from 128 to 64 or even 32 cells in order to minimize the leakage provides a solution. This however, complicates the overall memory design. Another solution to this problem is described in co-pending application Ser. No. 09/261,915 (filed Mar. 3, 1999) entitled "Dual VT SRAM Cell with Bit Line Leakage Control," now U.S. Pat. No. 6,181,608.

Another approach to the scaling problem is to use single-ended full-swing sensing. Here, one of the bit lines swings, for instance, to 50% or so of the Vcc potential before sensing occurs. An example of a single-ended sense amplifier is described in "Reference-Free Single-Ended Clocked Sense Amplifier Circuit," Ser. No. 09/302,677 (filed Apr. 30, 1999 now U.S. Pat. No. 6,137,319.

In both the single-ended and differential mode sensing schemes conventional high-threshold voltage SRAM cells and dual voltage SRAM cells are used. With the dual voltage SRAM cells, the passgate transistors coupling the cell to the bit line have a lower threshold voltage than other transistors in the memory array. While this speeds up sensing, it degrades noise margins in single-ended sensing. What is needed is to decrease leakage without increasing delay.

DETAILED DESCRIPTION OF THE PRESENT INVENTION

An improved static random-access memory (SRAM) cell is described. In the following description, numerous specific details are set forth, such as examples of threshold voltages in order to provide a thorough understanding of the present invention. It will be apparent to one skilled in the art that the invention may be practiced without these specific details. In other instances, well-known circuits and processes of fabrication have not been described in detail in order not to obscure the present invention.

Figure 1:
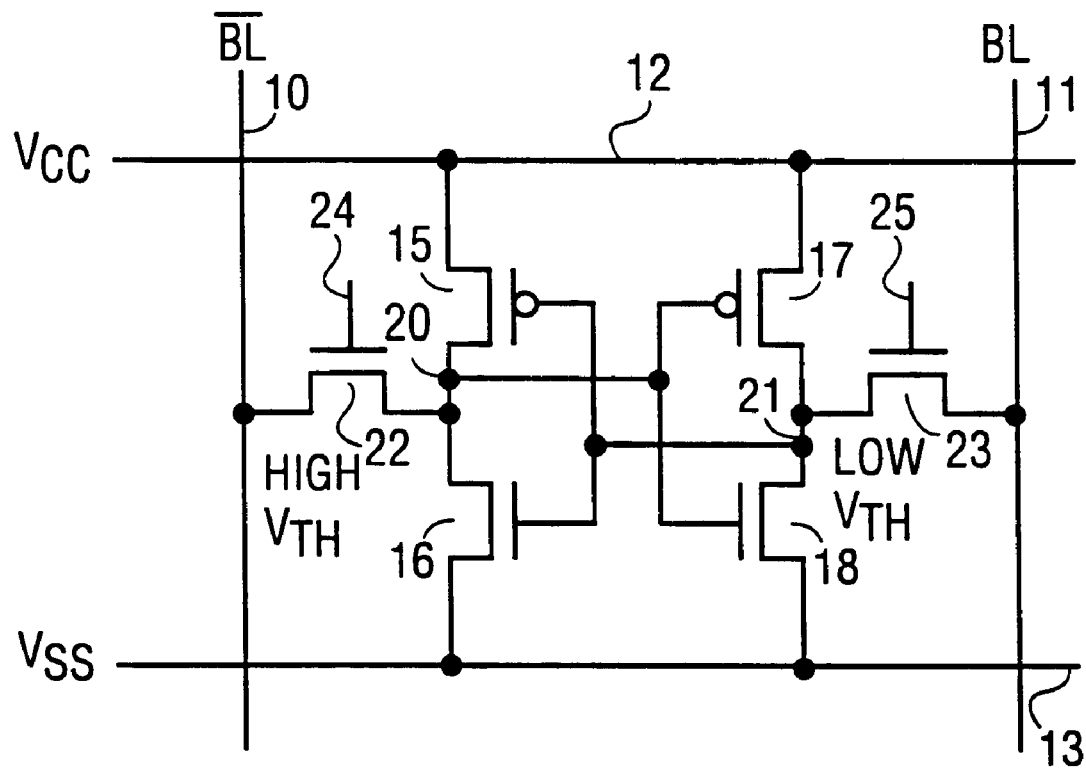
FIG. 1 is a memory cell in accordance with an embodiment of the present invention.

Referring to FIG. 1, the SRAM cell comprises a bistable circuit, that is, a circuit having two stable state. The circuit comprises a pair of cross-coupled inverters specifically, an inverter formed by the p-channel transistor 15 and the n-channel transistor 16 and an inverter formed by the p-channel transistor 17 and the n-channel transistor 18. The gates of the transistors 15 and 16 are coupled to node 21, one of the output nodes of the bistable circuit. This node is between the transistors 17 and 18. Similarly, in this symmetrical bistable circuit, the gates of transistors 17 and 18 are coupled to the other output node of the bistable circuit, node 20. This node is between the transistors 15 and 16. As is well-known, this bistable circuit comprising transistors 15, 16 17 and 18 assumes one of two stable states, one with node 20 high and node 21 low, and the other with node 21 high and node 20 low.

Power is applied to the bistable circuit through the lines 12 and 13 with line 12 typically being at a positive potential and line 13 at ground.

The bistable circuit is coupled to complementary bit lines 10 and 11. This coupling occurs through the n-channel passgate transistors 22 and 23. The gates of the transistors 22 and 23, gates 24 and 25, respectively; are connected to a word line in a memory array. When the word like is selected, the bistable circuit is coupled to the bit lines permitting the state of the bistable circuit to be sensed (reading) or the state of the bistable circuit to be set (writing). Typically, the bistable circuit with the passgate transistors is referred to as memory cell.

In single-ended sensing one line is used for sensing and the other complementary line is coupled to, for instance, an inverter to provide balancing.

In accordance with the teachings of one embodiment of the present invention, the threshold voltages of the transistors 22 and 23 are different. As shown in FIG. 1, the n-channel 22 has a higher threshold voltage than the n-channel transistor 23. As will be discussed later, transistor 23 (lower threshold voltage) is coupled to the bit line used for the single-ended sensing. By way of example, transistor 23 may have a threshold voltage of approximately 200 mV, whereas transistor 22 may have a threshold voltage of approximately 300 mV.

Several different, well-known processing methods can be used to obtain the difference in thresholds between transistors 22 and 23. In one embodiment, the dual thresholds are obtained by ion implanting the channel of one of the transistors differently than the channel of the other. For instance, the channel of transistor 23 may be ion implanted with an n-type dopant to lower the threshold of the transistor 23. Another method for obtaining the dual thresholds is to use transistors of different sizes. In another embodiment different thresholds are obtained by having a different gate oxide thickness for the transistors 23 and 24. In one embodiment, the transistor 22 has the same threshold voltage as the n-channel transistors 16 and 18. For this embodiment the p-channel transistors 15 and 17 also have high threshold voltages. Also, body biasing can be used.

Figure 2:
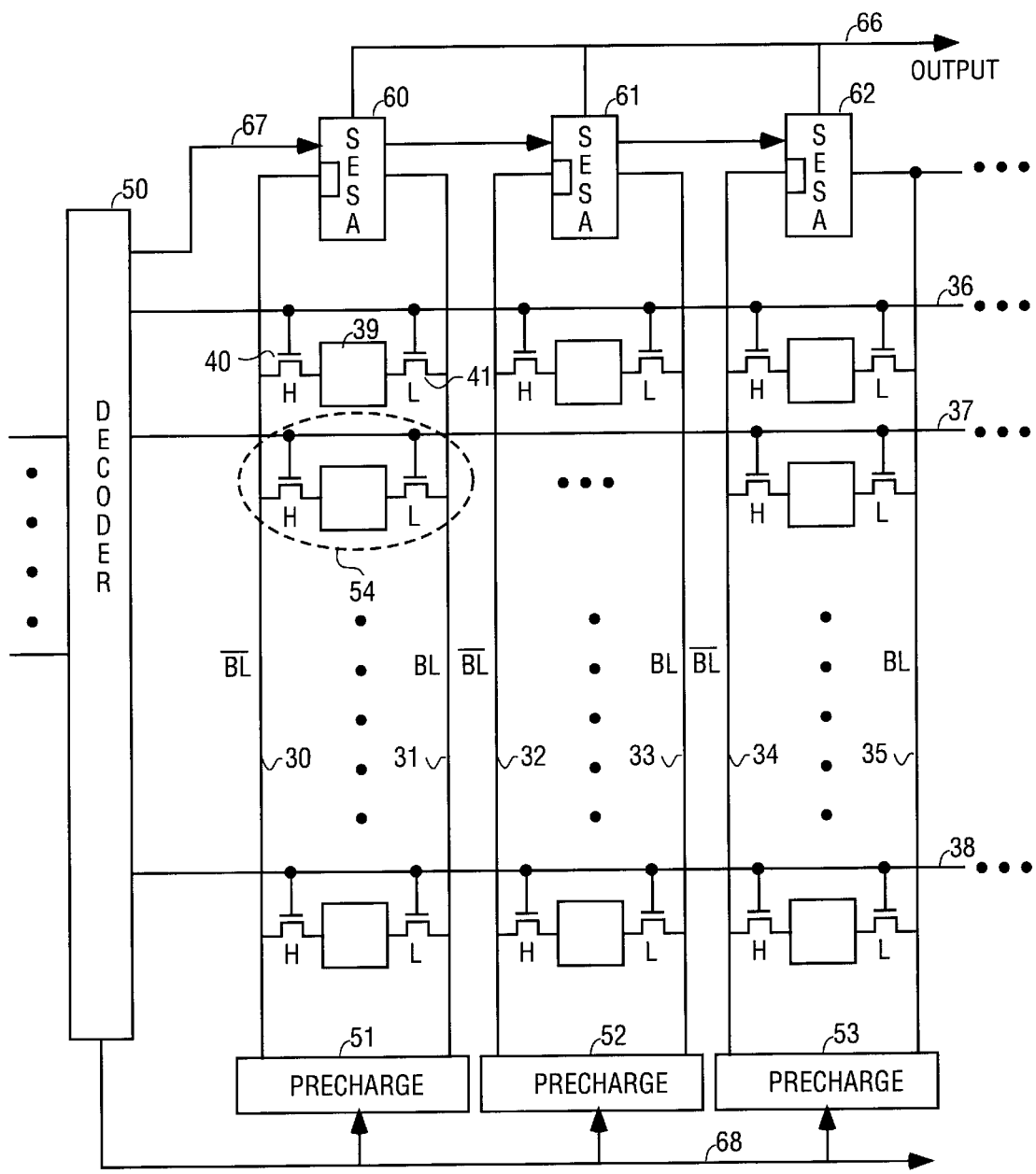
FIG. 2 illustrates a portion of a memory array employing the present invention.

In FIG. 2 an array is illustrated having a plurality of complementary bit line pairs, such as pairs 30 and 31, 32 and 33, 34 and 35. The word lines from the address decoder 50 are disposed in an orthogonal direction to the bit lines, such as the word lines 36, 37 and 38.

Cells are formed at the intersection of the word lines and the bit lines. For instance, memory cell 54 is disposed at the intersection of the word line 37 and the bit line pairs 30 and 31. Each of the memory cells may be identical to the memory cell shown in FIG. 1, for example it may comprise a bistable circuit 39 and passgate transistors 40 and 41. As shown in FIG. 2, the passgate transistor 41 is designated with an "L" indicating that it has a lower threshold than transistor 40 which is designated with an "H."

One of the bit lines from each bit line pair is connected to a single-ended sense amplifier (SESA). Specifically, as shown in FIG. 2, the bit line 31 is coupled to the amplifier 60, bit line 33 to the amplifier 61 and bit line 35 is coupled to the amplifier 62. The other lines such as lines 30, 32 and 34 are coupled to the SESAs only for providing balance. These lines are not part of the sensing circuit.

In operation, when an address is received by the decoder 50, it is decoded and a word line is selected. In one embodiment, all the cells along a word line are accessed and during a read cycle the contents of the cells are sensed by the sense amplifiers. Each sense amplifier then provides a bit of data onto the bus 66.

The bit line pairs, as is typically done in the prior art, are precharged to a predetermined potential at the beginning of a read cycle by the precharge circuits 51, 52 and 53.

Often, leakage power is the dominant component of total active power in a large cache. Also, a very small fraction of the memory cells in such a cache are accessed every cycle. To make matters worse, the junction temperatures in a microprocessor are relatively high during active operation. This increases the leakage. As mentioned above, there is more leakage associated with the low threshold voltage transistors. One way to compensate for this is to precharge only those bit lines in sub-blocks of the array which will be accessed. This is what is described below for one embodiment in FIG. 2 where, for instance, every other column of the array is accessed for any given cycle. In order to do this in a cache without losing time, addresses may be pipelined so that the next address can be evaluated to determine which portion of the array is to be accessed. This is used to determine which lines are to be precharged and for the example of FIG. 2, which sense amps are to be selected. By not precharging all the lines for every cycle, considerable power can be saved.

To this end, the decoder circuit 50 may, for instance, in addition to selecting a word line select every other one of the sense amplifiers over lines 67 and additionally cause every other one of the precharge circuits to precharge the appropriate bit line pair over lines 68. The data from alternate sense amps in then multiplexed onto bus 66. For example, there may be 16 columns, only 8 of which are precharged in any given read cycle, thereby providing a byte of data on the bus 66. This arrangement has the advantage of reducing the power consumption since only half the bit lines pairs are selected for precharging in any given read cycle.

While in FIG. 2 certain columns are selected or not selected for precharging; banks, blocks, subarrays or other groupings can be selected or not selected for precharging to save power.

As can be seen above, the memory cells employ a low voltage threshold transistor only on the SESA side of the cell. As mentioned earlier, noise margins degrade because of the leakage associated with the lower threshold voltage transistors. The advantage obtained through the lower threshold voltage transistor is that it has a larger drive current and consequently, improves the bit line delay significantly for the single-ended bit line sensing.

Thus, an improved SRAM cell and memory array has been described.

What is claimed is:

1. A memory cell comprising:
   a pair of lines;
   a bistable circuit having first and second nodes;
   a first passgate transistor coupling the first node to one of the pair of lines;
   a second passgate transistor coupling the second node to the other one of the pair of lines, the second passgate transistor having a lower threshold voltage than the first passgate transistor.

2. The memory cell of claim 1 wherein the pair of lines are complementary when data is written into or read from the cell.

3. The memory cell defined by claim 2 wherein the first and second transistors are n-channel transistors.

4. The memory cell defined by claim 1 wherein the bistable circuit comprises a pair of cross-coupled inverters each having an n-channel and a p-channel transistor.

5. The memory cell defined by claim 4 wherein the threshold voltage of the n-channel transistors in the pair of cross-coupled inverters is approximately equal to the threshold voltage of the first passgate transistor.

6. The memory device defined by claim 1 wherein the difference in threshold voltages between the first and second pass gate transistors results from different ion implantation of the channel regions of the transistors.

7. The memory cell defined by claim 6 wherein the threshold voltage of the second passgate transistor is approximately 100 mV.

8. The memory cell defined by claim 1 wherein gates of the first and second passgate transistors are coupled to a common word line.

9. A memory cell comprising:
   a bistable circuit having complementary output nodes;
   a first passgate transistor coupled to one of the output nodes, the first passgate transistor having a first threshold voltage;
   a second passgate transistor coupled to the other of the output nodes, the second passgate transistor having a second threshold voltage different than the first threshold voltage.

10. The memory cell defined by claim 9 wherein the first and second passgate transistors are n-channel transistors.

11. The memory cell defined by claim 10 wherein the difference in threshold voltages between the first and second passgate transistors results from different implantation of the channel regions of the transistors.

12. The memory cell defined by claim 11 wherein the bistable circuit comprises a pair of cross-coupled inverters.

13. The memory cell defined by claim 9 wherein the bistable circuit comprises a pair of cross-coupled inverters.

14. A memory cell comprising:
   a pair of cross-coupled inverters forming a bistable circuit having a first and a second output node; and
   a pair of transistors coupled to pass signals from the first and second nodes, respectively, the transistors having different threshold voltages.

15. The memory cell defined by claim 14 wherein the transistors are n-channel transistors.

16. The memory cell defined by claim 15 wherein the channels of the transistors have different levels of ion implantation.

17. A memory array comprising:
- a plurality of spaced-apart, parallel, complementary bit lines;
- a plurality of spaced-apart word lines running generally perpendicular to the bit lines;
- a plurality of sense amplifiers, each amplifier coupled to one of the bit lines in each pair of bit lines;
- a plurality of bistable circuits disposed generally at the intersection of the word lines and pairs of bit lines, each of the bistable circuits being coupled to its respective bit lines through a pair of passgate transistors having gates coupled to one of the word lines, the threshold voltage of one of the transistors in each of the pairs of transistors being different than the threshold voltage of the other transistor in the pair.

18. The memory array defined by claim 17 wherein the one of the passgate transistors, coupling the bistable circuit to the one of the complementary bit lines which is coupled to the sense amplifier, has a lower threshold voltage than the other passgate transistor.

19. The memory cell defined by claim 17 wherein one of the passgate transistors in the pair of passgate transistors has different ion implantation in its channel region than does the other passgate transistor.

20. A memory array comprising:
- a plurality of spaced-apart, parallel, complementary bit lines;
- a plurality of spaced-apart word lines running generally perpendicular to the bit lines;
- a plurality of sense amplifiers, each amplifier coupled to one of the pair of complementary bit lines;
- a plurality of bistable circuits disposed generally at the intersection of the word lines and pairs of bit lines, each of the bistable circuits being coupled to its respective bit lines through a pair of passgate transistors, where gates of the passgate transistor are coupled to one of the word lines, and where a threshold voltage of one of the passgate transistors in each of the pairs of transistors is different than the threshold voltage of the other passgate transistor; and
- a decoder for examining address signals and for selecting fewer than all the bit lines for precharging.

21. The array defined by claim 20 wherein the passgate transistors are n-channel transistors.

* * * * *